(12) United States Patent
Roquelaure

(10) Patent No.: US 7,688,932 B2
(45) Date of Patent: Mar. 30, 2010

(54) DETECTION OF A DIGITAL COUNTER MALFUNCTION

(75) Inventor: Philippe Roquelaure, Bouc Bel Air (FR)

(73) Assignee: STMicroelectronics SA, Montrouge (FR)

(*) Notice: Subject to any disclaimer, the term of this patent is extended or adjusted under 35 U.S.C. 154(b) by 60 days.

(21) Appl. No.: 11/971,730

(22) Filed: Jan. 9, 2008

(65) Prior Publication Data

US 2008/0165913 A1    Jul. 10, 2008

(30) Foreign Application Priority Data

Jan. 10, 2007   (FR)   ................... 07 52600

(51) Int. Cl.
*G06M 3/00* (2006.01)
(52) U.S. Cl. .......................................... 377/28; 377/39
(58) Field of Classification Search ................ None
See application file for complete search history.

(56) References Cited

U.S. PATENT DOCUMENTS

| 4,189,635 A | 2/1980 | Sheller |
| 4,373,201 A * | 2/1983 | Bohan, Jr. ................... 714/820 |
| 5,095,264 A * | 3/1992 | Hulsing, II ............... 324/76.47 |
| 5,164,969 A * | 11/1992 | Alley et al. .................... 377/39 |
| 5,440,604 A * | 8/1995 | De Subijana et al. .......... 377/28 |
| 5,481,580 A | 1/1996 | Guzinski |
| 6,215,838 B1 * | 4/2001 | Liu et al. ..................... 377/28 |

OTHER PUBLICATIONS

Maheshwari, A., et al., "Trading Off Reliability and Power-Consumption in Ultra-Low Power Systems," Proceedings of the International Symposium on Quality Electronic Design, Mar. 18, 2002, pp. 361-366.

* cited by examiner

*Primary Examiner*—Tuan Lam
(74) *Attorney, Agent, or Firm*—Lisa K. Jorgenson; Robert Iannucci; Seed IP Law Group PLLC

(57) ABSTRACT

A method and a circuit for detecting a malfunction of at least one first counter controlled by a first signal, in which a second counter, controlled by a second signal identical to the first signal or to its inverse, and counting in the reverse direction with respect to the first counter, is set with a value complementary to a setting value of the first counter; the respective current values of the first and second counters are added up; and the current sum is compared with at least one value representing the greatest one of the setting values or this greatest value plus one.

17 Claims, 5 Drawing Sheets

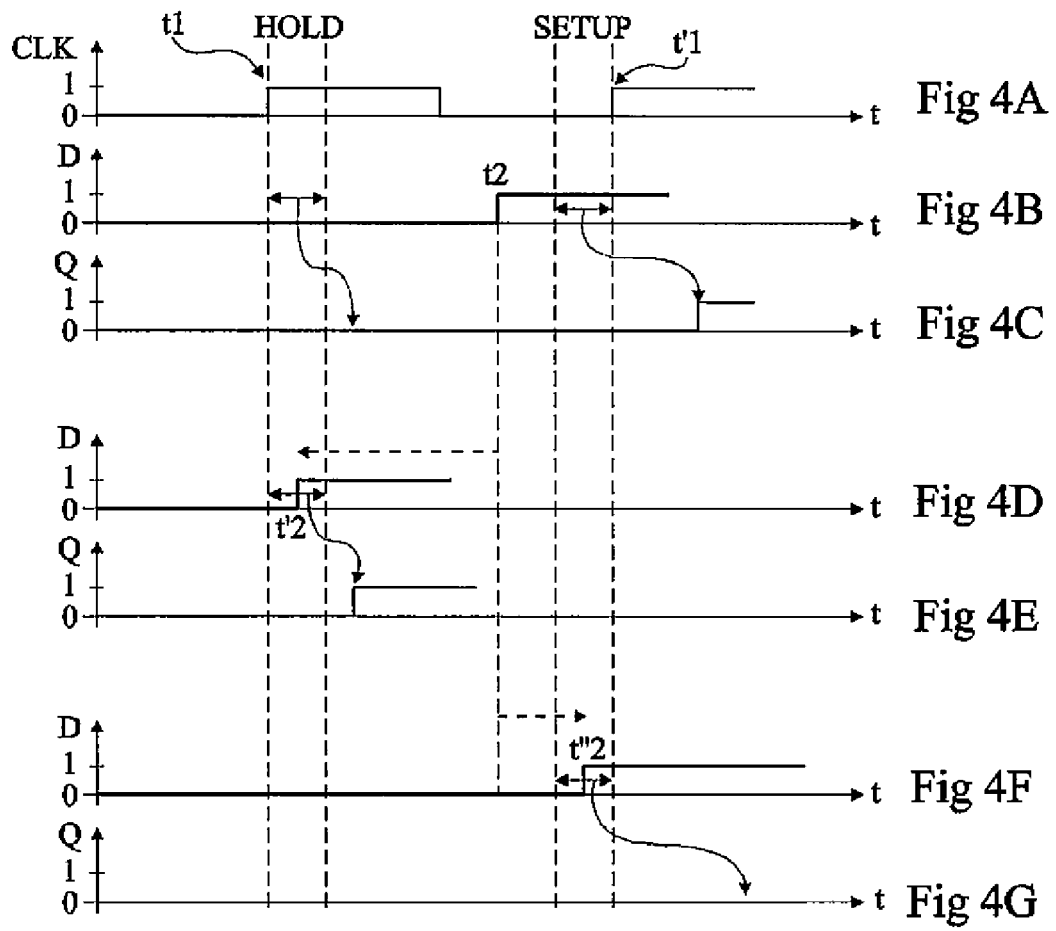
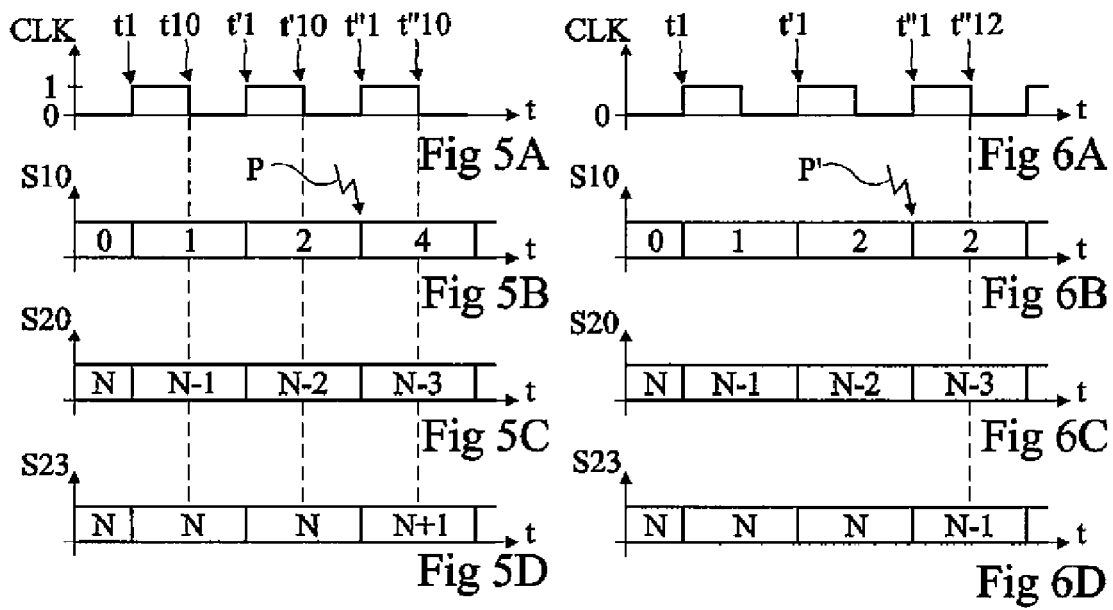

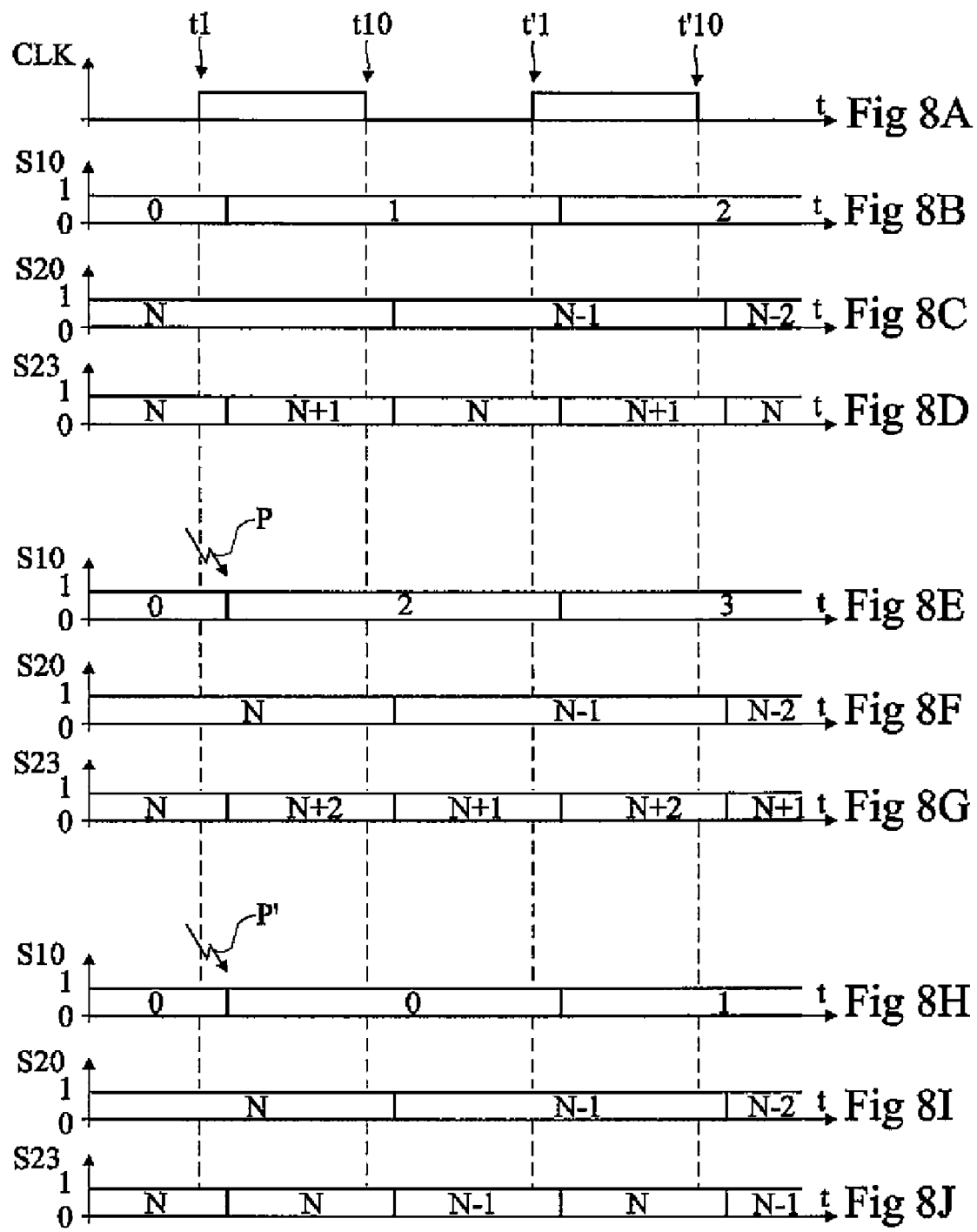

DETECTION OF A DIGITAL COUNTER MALFUNCTION

TECHNICAL FIELD

The present disclosure generally relates to electronic circuits and, more specifically but not exclusively, to digital counters rated by a clock.

The present disclosure more specifically but not exclusively applies to detecting a possible malfunction of a counter in an electronic circuit.

BACKGROUND INFORMATION

Counters integrated in electronic circuits are generally made in the form of an assembly of flip-flops which are either set to zero or pre-loaded so that the counter exhibits a given value. According to cases, the counter is incremented or decremented on each edge of a given direction (rising or falling) of a clock signal.

Counters of electronic circuits have multiple uses. For example, they may be used to rate a central processing unit (program counter), to count a number of events occurring in an integrated circuit, be it or not to condition the subsequent circuit operation, etc.

According to a first example of application, a disturbance of the operation of a counter may result in modifying the operation of a program processing unit. Such a disturbance may be incidental or voluntary (fault injection), in particular in cryptographic or secured applications of operation of an integrated circuit.

BRIEF SUMMARY

An embodiment provides capability to detect a possible malfunction of a counter in an integrated circuit.

According to another example of application, an embodiment provides capability to be able to detect possible drifts of a clock used to rate the operation of a circuit.

An embodiment of the present invention detects a malfunction of at least one counter.

An embodiment of the present invention detects a drift of a periodic signal.

An embodiment of the present invention also provides information about the source of a malfunction of a counter.

An embodiment of the present invention provides a method for detecting a malfunction of at least one first counter controlled by a first signal, in which:

a second counter, controlled by a second signal identical to the first signal or to its inverse, and counting in the reverse direction with respect to the first counter, is set with a value complementary to a setting value of the first counter;

the respective current values of the first and second counters are added up; and the current sum is compared with at least one value representing the greatest one of the setting values or this greatest value plus one.

According to an embodiment, the control signals are periodic.

According to an embodiment, the sum of the respective values of the two counters is compared with two values respectively corresponding to the greatest of the setting values of the counters and to this greatest value plus one, the comparisons being respectively synchronized on reverse edges of the first signal.

According to an embodiment, the first counter is set to zero, the second counter being set to the maximum counting value of the first one.

An embodiment of the present invention provides a method for protecting a clock signal of an electronic circuit, said clock signal being used as a base for the control of the two counters.

An embodiment of the present invention provides a method for protecting a counter against a violation of its value.

An embodiment of the present invention provides a circuit for detecting a malfunction of at least one counter controlled by a first signal, comprising:

a second counter capable of being controlled by a second signal identical to the first signal or to its inverse and of varying in the reverse direction with respect to the first counter;

an adder of the respective current values of the two counters; and at least one comparator of the result provided by the adder with respect to the greatest of two respective complementary setting values of the counters or with this greatest value plus one.

According to an embodiment, two comparators compare the result of the adder with two values respectively corresponding to said greatest one of the setting values of the counters and to this greatest value plus one, the comparisons being capable of being respectively synchronized on inverse edges of the first signal.

According to an embodiment, the different components of the detection circuit are distributed at different locations of the electronic circuit which integrates it.

According to an embodiment, the detection circuit is applied to the detection of one or several attempts of disturbance of the operation of an electronic circuit.

According to an embodiment, the detection circuit is applied to the detection of a drift of an environmental parameter of an electronic circuit.

The foregoing and other features will be discussed in detail in the following non-limiting and non-exhaustive description of specific embodiments in connection with the accompanying drawings.

BRIEF DESCRIPTION OF THE SEVERAL VIEWS OF THE DRAWINGS

FIGS. 4A, 4B, 4C, 4D, 4E, 4F, and 4G illustrate the example operation of one embodiment of the flip-flop of FIG. 3;

FIGS. 5A, 5B, 5C, and 5D illustrate an example of operation of one embodiment of the circuit of FIG. 2;

FIGS. 6A, 6B, 6C, and 6D illustrate another example of operation of one embodiment of the circuit of FIG. 2;

FIGS. 8A, 8B, 8C, 8D, 8E, 8F, 8G, 8H, 8I, and 8J illustrate the example operation of one embodiment of the circuit of FIG. 2;

DETAILED DESCRIPTION

Figure 1:
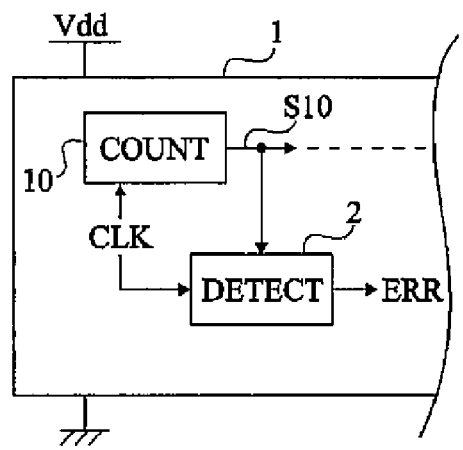
FIG. 1 partially shows in the form of blocks an example of an electronic circuit of one embodiment.

In the following description, numerous specific details are given to provide a thorough understanding of embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Same elements have been designated with same reference numerals in the different drawings.

One or more embodiments of the present invention will be described hereafter in relation with an example of application to the detection of a disturbance in the operation of an electronic circuit integrating a counter (for example, a fault injection). It however more generally applies to any detection of a malfunction of a counter or of its rating signal, be it an incidental or caused malfunction.

FIG. 1 is a partial block diagram of an electronic circuit 1 comprising a counter 10, a possible malfunction of which is desired to be detected. Counter 10 (COUNT) is started by a signal CLK (for example, periodic). An output S10 of counter 10 providing its current value is provided not only to elements, not shown, of circuit 1 for exploitation (for example, a central processing unit, a processor, etc.), but also to a circuit 2 of detection (DETECT) of a possible malfunction. Circuit 2 receives the same rating signal CLK as counter 10 and provides, for example, a bit ERR indicative of a malfunction of counter 10. Counter 10 and detection circuit 2 are powered by a D.C. voltage Vdd corresponding, for example, to the supply voltage or to one of the several power supply voltages of circuit 1.

Figure 2:
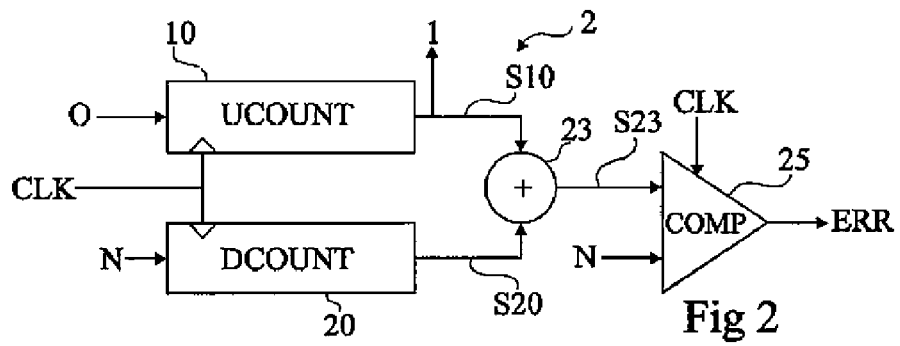
FIG. 2 is a block diagram of an embodiment of a circuit for detecting a counter malfunction of one embodiment.

FIG. 2 is a block diagram of an embodiment of a circuit 2 for detecting a possible malfunction of a counter 10. The case of a counter 10 incremented (UCOUNT) at each period of a clock signal CLK and set to a zero value (0) is assumed. Counter 10 is intended to count up to a maximum count N. Its output S10 provides its current value to the rest of circuit 1.

According to this embodiment, detector 2 comprises a downcounter 20 (DCOUNT) set to a value N corresponding to the final count likely to be reached by counter 10 and triggered by the same signal CLK (or its inverse). The respective current values S10 and S20 of counters 10 and 20 are summed up (adder 23) and the result of this sum is compared (comparator 25) with a value N. The comparison is for example performed on the falling edges of signal CLK. In case of an inequality between the values present on its two inputs, comparator 25 outputs a signal ERR indicative of a malfunction of counter 10, that is, of an error in its count. As a variation, comparator 25 compares, on the rising edges of signal CLK, the result of the sum with value N. Adder 23 is, for example, an assembly of OR-type logic gates combining two-by-two the bits of the different ranks of the two counters 10 and 20. Comparator 25 for example is a logic comparator combining the results of the bit-to-bit sums. As a variation, the adding and comparison functions may be combined.

If they are controlled by an identical signal, be it periodic or not, two counters operating in reverse directions, that is, one decrementing a maximum value (N) and the other incrementing a minimum value (0), have at any time all of their respective bits with opposite states.

Accordingly, the sum of their two current values is in principle constant (equal to N). If such is not the case, this means that one of the two counters has undergone a malfunction.

Figure 3:
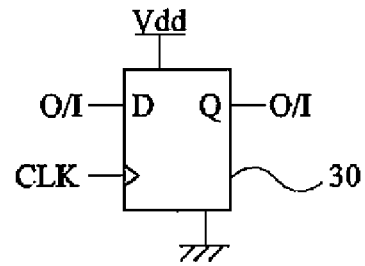
FIG. 3 shows a flip-flop constitutive of an element of a counter of one embodiment.

FIG. 3 shows the diagram of a flip-flop 30 forming a counting circuit. A counter 10 or 20 is indeed formed from a succession of flip-flops having their respective Q outputs providing the different counter bits, the flip-flops being assembled in cascade with the Q outputs of the flip-flops of former rank provided at the D inputs of the flip-flops of next rank, possibly combined by an AND gate with the result of the flip-flop of still former rank. This is a synchronous counter. There also exist asynchronous counters in which only the first flip-flop receives a triggering signal, each other flip-flop being triggered by the output of the flip-flop of former rank and all the flip-flop inputs receiving a high level.

FIGS. 4A to 4G illustrate the operation of a flip-flop 3 of a synchronous counter in a state switching. FIG. 4A shows an example of the shape of clock signal CLK. FIGS. 4B and 4C illustrate a normal operation of the flip-flop. FIGS. 4D and 4E illustrate a malfunction of the flip-flop occurring during its hold time (HOLD), which corresponds to the time required after a triggering edge (for example, rising) of the clock signal to guarantee that a state switching of the D input of the flip-flop is taken into account. FIGS. 4F and 4G illustrate another case of malfunction based on the flip-flop setup time (SETUP), which corresponds to the required time of presence of the data at the flip-flop input before the triggering edge of signal CLK to guarantee that a state switching of the D input of the flip-flop is taken into account.

In normal operation (FIGS. 4B and 4C), for each rising edge (time t1, t'1) of signal CLK, the state of the data present on the D input is transferred onto the Q output. In the example of FIGS. 4B and 4C, a zero state is assumed at first edge t1 and a 1 state is assumed at second edge t'1, after a state switching of the D input at a time t2. For the data to be taken into account, the respective states 0 and 1 must be present long enough before the triggering edge (time period at least equal to the flip-flop setup time SETUP) and be present long enough after this triggering edge (at least for a time period corresponding to the hold time HOLD). The setup and hold times are parameters characteristic of the flip-flops which depend, among others, on manufacturing parameters.

If time t2 of state switching of data D is brought forward by a duration such that it occurs at a time t'2 (FIG. 4D), for the hold time period linked to the former clock edge t1, this risks resulting in a state switching of output Q (FIG. 4E) of the flip-flop, whereby the current value of the counter is modified.

Conversely, if data D (FIG. 4F) is delayed by a sufficient duration, so that this change occurs (time t"2) after the beginning of the setup time SETUP linked to the next edge t'1 of the clock signal, this risks preventing the taking into account of the state switching on the Q output (FIG. 4G) and here again disturb the flip-flop value.

In the first case of acceleration of the data (FIGS. 4D and 4E), this results in an anticipated increment of the counter value, which alters its value.

In the second case of deceleration of the data (FIGS. 4F and 4G), this results in a lack of increment of the counter, which also alters its value. The same phenomenon occurs in case of an acceleration of clock signal CLK.

Signal CLK is not necessarily periodic, provided for the two counters 10 and 20 to be controlled by the same signal and its inverse. For simplification, reference will be made hereafter to a clock signal.

FIGS. 5A to 5D and 6A to 6D are timing diagrams illustrating the operation of the circuit of FIG. 2. FIGS. 5A and 6A illustrate an example of signal CLK. FIGS. 5B and 6B illustrate examples of values taken by counter 10. FIGS. 5C and 6C illustrate examples of values taken by counter 20. FIGS. 5D and 6D illustrate examples of values taken by output S23 of adder 23.

In normal operation, counter 10 is incremented on the rising edges (times t1, t'1) of the clock signal and thus successively takes values 0, 1, and 2. In the shown example, counter 20 is also decremented on the rising edges of this clock signal and thus successively takes values N, N−1, and N−2. In a normal operation, the sum of the counts of the two counters 10 and 20 is constant and equal to value N. Comparator 25, sampled in this example on falling edges t10, t'10, verifies result S23 of adder 23 against value N.

FIGS. 5A to 5D illustrate an example of malfunction (disturbance P) causing an anticipated increment of counter 10, which takes value 2 after clock signal t"1. Disturbance P may be detected from as soon as time t"10 since sum S23 provided by adder 23 is N+1.

FIGS. 6A to 6D illustrate another example of a malfunction (disturbance P') corresponding to a lack of increment of counter 10 at time t"1 which keeps value 2. Sum S23 then provides value N−1. Here again, the sampling on the falling edges of this sum S23 enables detecting the malfunction from as soon as time t"10.

Figure 7:
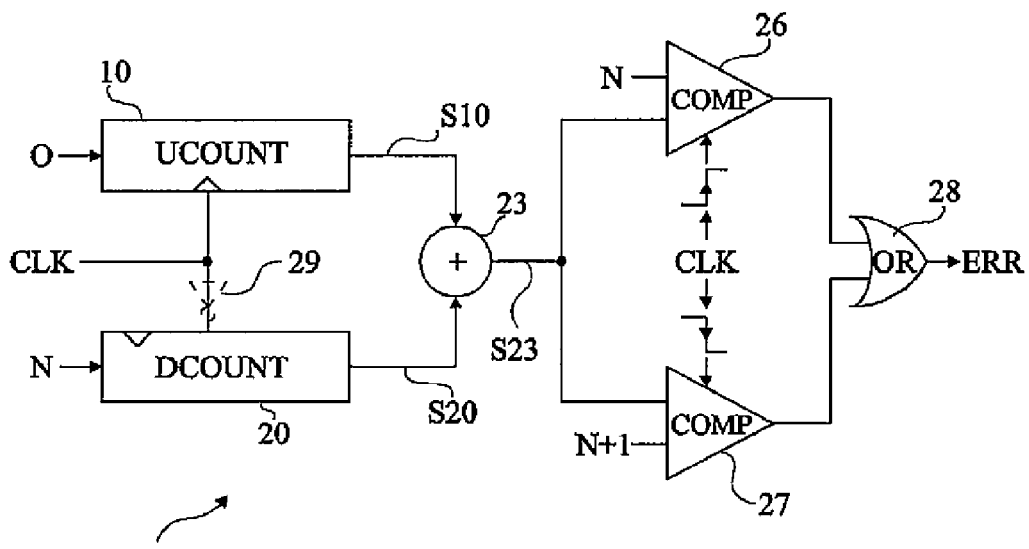
FIG. 7 is a block diagram of another embodiment of a circuit for detecting a counter malfunction.

FIG. 7 shows another embodiment of a detection circuit 2'. A first counter 10 (UCOUNT) incremented under control of a signal CLK, for example, periodic, is set to a value 0 while a second counter 20 (DCOUNT) with no control of signal CLK or of its inverse (inverter 29 in dotted lines) is set to a value N, corresponding to the maximum count of counter 10 (set by its number of flip-flops in cascade set to the high state). The respective current outputs S10 and S20 of counters 10 and 20 are summed up. Two comparators 26 and 27 are used to compare the current state of output signal S23 of the adder 23, respectively with value N and with value N+1. Comparators 26 and 27 are respectively sampled on the rising and falling edges of signal CLK. The outputs of comparators 26 and 27 are combined by an OR gate 28 providing detection result signal ERR.

FIGS. 8A to 8J illustrate the operation of a detection circuit such as shown in FIG. 2. A steady clock signal CLK (FIG. 8A) is assumed. FIGS. 8B, 8E, and 8H illustrate examples of values taken by counter 10. FIGS. 8C, 8F, and 8I illustrate examples of values taken by counter 20. FIGS. 8D, 8G, and 8J illustrate examples of values taken by output S23 of adder 23.

In normal operation, counter 10 is incremented, for example, on rising edges (times t1, t'1) of the clock signal and thus successively takes values 0, 1, and 2. In the example of FIGS. 8A to 8J, counter 20 is decremented on the falling edges (times t10, t'1) of this clock signal and thus successively takes values N, N−1, and N−2. In the timing diagrams of FIGS. 8A to 8J, a slight time shift between the change of value of counters 10 and 20 of the clock signal has been illustrated to represent a propagation time. Whatever the signal propagation time, said time is regular in a normal operation and its actual value is of no importance.

In a normal operation such as illustrated in FIGS. 8A to 8D, the sum of the counts of the two counters 10 and 20 successively takes values N, N+1, N, N+1, N, etc. Accordingly, by sampling the comparator on the edges of same type of the clock signal, a constant value of the counter is obtained. In the representation of FIG. 7, comparators 26 and 27 verify result S23 against successive values N and N+1 that must be taken by the sum of the states.

FIGS. 8E to 8G illustrate a first malfunction case (disturbance P) causing an anticipated increment of counter 10 which takes, in this example, value 2 after clock edge t1, then value 3 after clock edge t'1, etc. Disturbance P may be detected from as soon as time t10 since the respective states at the output of adder 23 become N, N+2, N+1, N+2, N+1, etc.

FIGS. 8H to 8J illustrate another example of a malfunction (disturbance P') corresponding to a lack of increment of counter 10 at time t1. Counter 10 then takes value 0 after clock edge t1, then value 1 after clock edge t'1, etc. Accordingly, sum S23 respectively provides values N, N, N−1, N, N−1, etc. Here again, the sampling on the falling edges of sum S23 enables detecting the malfunction from as soon as time t10.

It should be noted that the error detection is valid whatever the values taken by the counters after the disturbance, that is, whatever the influence of the malfunction.

The fact or triggering counters 10 and 20 on the inverse clock edges improves the detection possibilities by avoiding for a disturbance reflected in the same way on both counters not to be taken into account.

According to an example of application, the detector detects disturbances in clock signal CLK, for example, caused by attacks aiming a disturbing the integrated circuit operation by attempting to disturb the circuit synchronization clock.

According to another example of application (that may be combined with the first one), the detector detects malfunctions (for example, fault-injection attacks) directly caused by the forcing of values of the flip-flops of one of the counters. Such a forcing may be performed to bring all flip-flops to the high state (positive attacks) or to the low state (negative attacks) and for example attempt to force the resetting of a counter.

Figure 9:
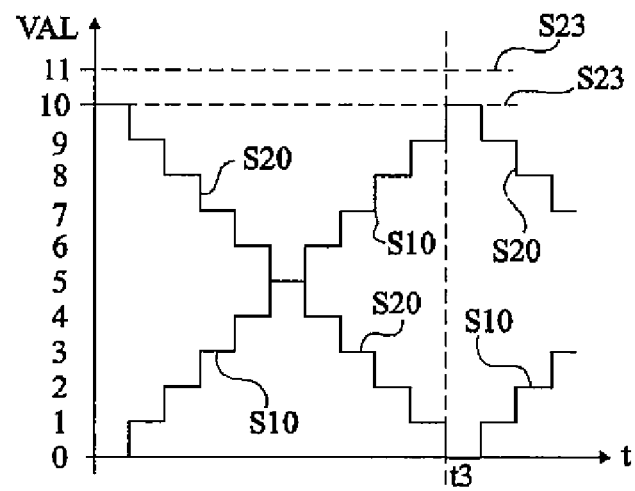
FIG. 9 illustrates the example operation of one embodiment of a detection circuit in the absence of a malfunction.
Figure 10:
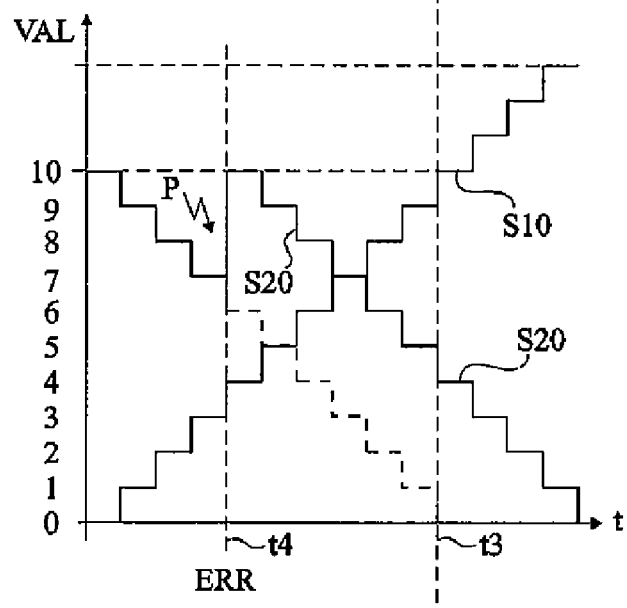
FIG. 10 illustrates the example operation of one embodiment of a detection circuit in the presence of an example of a malfunction.
Figure 11:
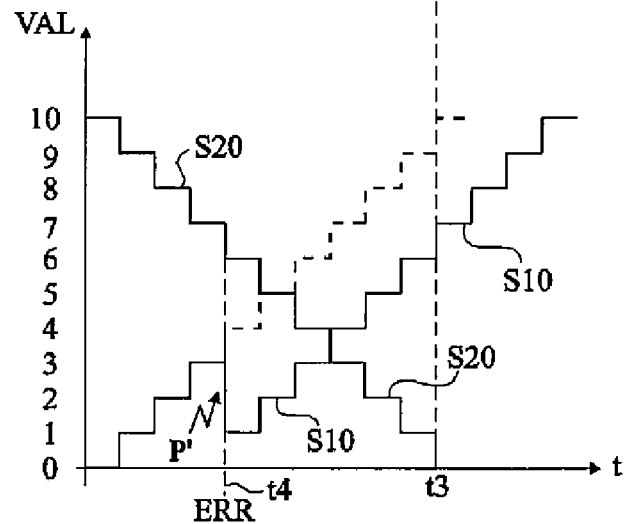
FIG. 11 illustrates the example operation of one embodiment of a detection circuit in the presence of another example of a malfunction.

FIGS. 9 to 11 illustrate, in simplified examples of low counting values (N=10), the operation of a detection circuit. These drawings are timing diagrams illustrating the variation of the current values VAL taken by counters 10 and 20.

FIG. 9 illustrates an example of normal operation in which counter 10, set to value 0, reaches value 10 at a time t3 while counter 20, set to value 10, reaches 0 at this time t3. If it is a time counter, counter 10 starts counting back from 0 after time t3. The sums of the respective values of counters 10 and 20 provide either value 10, or value 11, according to whether the sampling is performed on rising edges (value 10) or on falling edges (value 11).

FIG. 10 illustrates an example where, when it has reached value 7 (time t4), counter 20 is reset to value 10 under the effect of a disturbance P while the variation of counter 10 is not modified. The shapes of the normal operation (FIG. 9) are shown in dotted lines. From as soon as time t4 (to within a half period of the clock signal), the circuit detects the disturbance. If nothing is done, it can be seen that at theoretical end t3 of the counting time, the counter reaches its value 10. However, counter 20 then reaches an erroneous value (4). This case shows that what has been discussed in relation with the monitoring of the operation of a counter (10) also works for the monitoring of the operation of a downcounter (20). Further, this illustrates the case of counters undergoing different disturbances.

FIG. 11 illustrates an example of a disturbance P' occurring on counter 10 at a time t4 when it has reached count 3 and then recovers value 1. Here again, error signal ERR is obtained from as soon as time t4 (to within the clock signal half period). If nothing is done, counter 10 provides a value 7 at the end (time t3) of the expected counting period.

Figure 12:
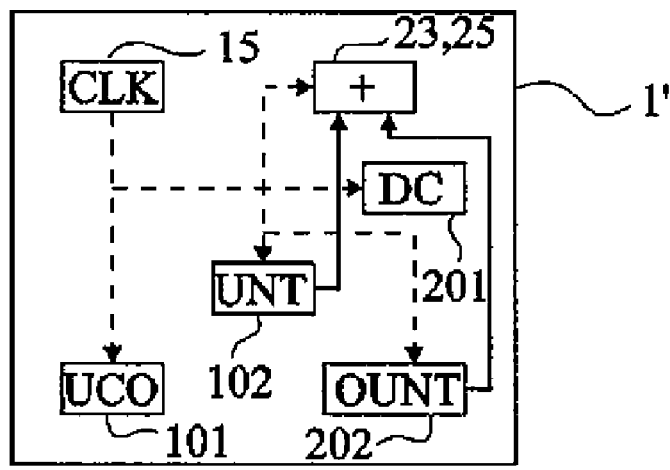
FIG. 12 is a block diagram of an embodiment of an integrated circuit equipped with a counter malfunction detector.

FIG. 12 is a block diagram partially showing an example of an integrated circuit 1' containing a circuit for detecting a possible malfunction of a counter. This drawing illustrates the case where the elements (flip-flops) forming counters 10 and 20 are distributed in different locations of the circuit. In this example, a first portion 101 (UCO) of counter 10 is dissociated from a second portion 102 (UNT) while a first portion 201 of counter 20 (DC) is dissociated from a second portion 202 (OUNT) of this counter. The respective counter outputs are provided to adder 23, here symbolized as combined with comparator 25 (or with comparators 26 and 27). All flip-flops are controlled by a same signal CLK (block 15).

Figure 13:
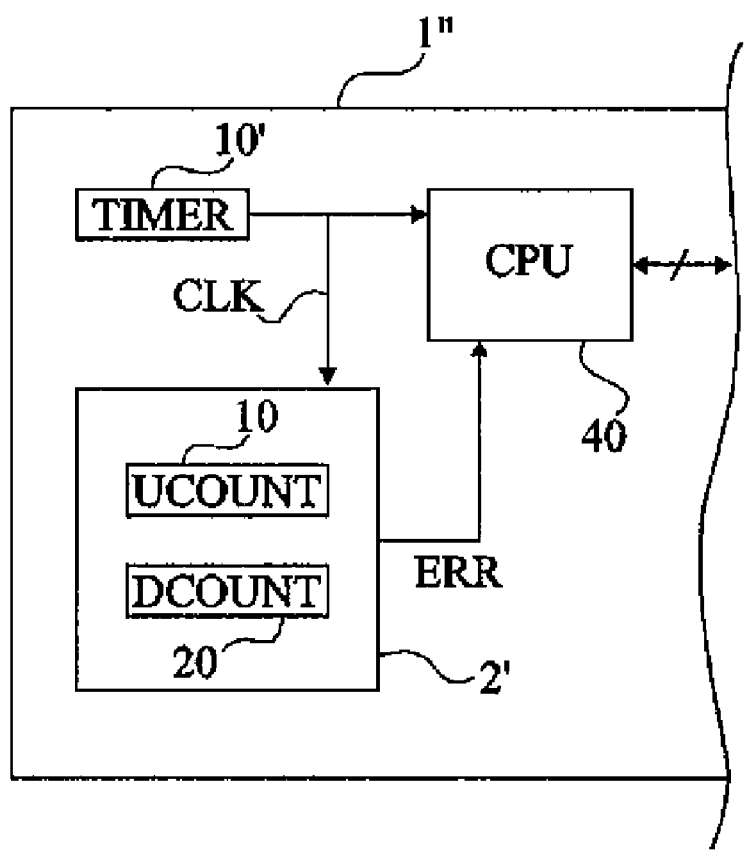
FIG. 13 illustrates an example of application to a detection of a drift of a periodic signal according to one embodiment.

FIG. 13 is a block diagram illustrating an example of application of an embodiment of the present invention to the protection of a clock signal CLK for rating a partially-shown electronic circuit 1''. For example, signal CLK rates a processing unit 40 (for example, the central processing unit CPU of a microprocessor executing programs, a decoding or ciphering circuit in wired logic, etc.). Signal CLK is itself generally provided by a timer 10' (TIMER) which has an output connected to a clock signal of unit 40 and receives a clock signal, not shown (identical or different from signal CLK). Circuit 1'' integrates a detection circuit 2' of the type described in relation with the preceding drawings. In the example of FIG. 13, it is assumed that circuit 2' integrates the two counters 10 and 20 used for the detection. This shows that the detection mechanisms may be cascaded in a same circuit to control more than two counters.

A feature of a malfunction detection circuit is that it can detect a disturbance attempt on a clock of a circuit, be this disturbance incidental or voluntary (piracy attempt of a so-called secure circuit, for example, a smart card or a circuit for controlling rights of access of toll television, telephony, Internet, etc. type).

Another feature is that its implementation is compatible with any counter type.

Of course, one or more embodiments of the present invention can have various alterations and modification.

In particular, the exploitation of the detection signal or the interpretation of the possible error causes depend on the application. For example, one may want more than an error signal and exploit the result of the sum of the current values of the two counters respectively controlled on the rising and falling edges of a same signal to determine the source of the malfunction. With a measurement on falling edges, in the case of a value N+1, the operation is normal. In the case of a value N+2, the data are accelerated. In the case of a value N, the data are decelerated or the clock signal is accelerated. In the case of a value 0 or 2N, the value of the flip-flops, respectively negative or positive, is modified (forced). For all other values, the origin of the malfunction is not identified but it remains detected. Such an interpretation of the values enables distinguishing different malfunction cases. Such a variation may be implemented in a version where the counters are in a same integrated circuit area to undergo the different disturbances in homogeneous fashion.

Further, it is not indispensable for the counters to be set to their respective maximum and minimum counts. It is enough for them to be set with values such that their sum is equal to the maximum count (N) decreased by the minimum value. This amounts to providing complementary values.

Further, the setup and hold times of the different flip-flops forming the counters are features likely to be adapted during the design of the integrated circuit and depend, among others, on elements (inverters, delay lines, etc.) setting the propagation times. Such an adaptation enables setting the detector sensitivity by modifying the time shifts to which it is sensitive. Such a sensitivity setting may be used, for example, to measure drifts of an environmental or integrated circuit manufacturing parameter. For example, knowing that the setup and hold times are sensitive to the circuit operating temperature, the detector may be used to detect whether the operating temperature of the circuit exits a range set by a time window linked to the setup and hold times. Other environmental operating parameters of the integrated circuit conditioning such setup and hold times may also be monitored (for example, the power supply voltage). According to another example, the detector is used to verify manufacturing conditions of a circuit. An acceptable range of counter flip-flop setup and hold times may indeed be defined and it may be verified, for example, on a reference circuit, that the manufacturing technology has not undergone any drift by verifying that the detector detects no counting error.

Moreover, the respective functions of the two circuit counters may be inverted, the detection circuit detecting a divergence between the two counters. For example, in an application to the protection of a counter against a violation of its value or to the protection of a clock signal, be it by modification of a clock signal or by modification of the flip-flop values, the counter to be protected may indifferently be the counter or the downcounter, or both.

Finally, although one or more embodiments of the present invention has been described in relation with an example of D flip-flops, it applies to counters formed with any type of flip-flops (for example, D, JK flip-flops, etc.) or another circuit performing the same function, and whatever the outputs (forward or reverse). Further, the forming of the adding and comparison elements of the detector is within the abilities of those skilled in the art by using current technologies for implementing such functions, be they separate or combined. In particular, although one or more embodiments of the present invention has been described in relation with a vocabulary referring to a hardware implementation, the analysis of the current values of the two counters may be carried out in software fashion, in particular in the case where the origin of the malfunction is desired to be identified.

Such alterations, modifications, and improvements are intended to be part of this disclosure, and are intended to be within the spirit and the scope of embodiments of the present invention. Accordingly, the foregoing description is by way of example only and is not intended to be limiting. The present invention is limited only as defined in the following claims and the equivalents thereto. The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

What is claimed is:

1. A method for detecting a malfunction of at least one first counter controlled by a first signal, the method comprising:
   setting a second counter controlled by a second signal identical to the first signal or to its inverse, and counting in a reverse direction with respect to the first counter, with a value complementary to a setting value of the first counter;
   adding respective current values of the first and second counters; and
   comparing a current sum with at least one value representing a greatest one of the setting values or this greatest value plus one.

2. The method of claim 1 wherein the first and second signals are periodic.

3. The method of claim 1 wherein the sum of the respective values of the two counters is compared with two values respectively corresponding to said greatest one of the setting values of the counters and to this greatest value plus one, the comparisons being respectively synchronized on respective edges of the first signal.

4. The method of claim 1 wherein the first counter is set to zero, the second counter being set to the greatest one of the setting values of the first counter.

5. The method of claim 1, further comprising protecting a clock signal of an electronic circuit, said clock signal being said first signal and being used as a base for control of the first and second counters.

6. The method of claim 1, further comprising protecting the first or second counter against a violation of its value.

7. A circuit for detecting a malfunction of a first counter controlled by a first signal, the circuit comprising:
   a second counter controlled by a second signal identical to the first signal or to its inverse and structured to vary in a reverse direction with respect to the at least one counter;
   an adder structured to add respective current values of the first and second counters; and
   at least one comparator structured to compare a result provided by the adder with respect to a greatest value of two respective complementary setting values of the counters or to this greatest value plus one.

8. The circuit of claim 7 wherein said at least one comparator includes two comparators structured to compare the result of the adder with two values respectively corresponding to said greatest one of the setting values of the counters and with this greatest value plus one, the comparators being respectively synchronized on edges of the first signal.

9. An electronic circuit, comprising:
   a first counter controlled by a first signal; and
   a detection circuit structured to detect a malfunction of said first counter, the detection circuit including:
   a second counter structured to be controlled by a second signal identical to the first signal or to its inverse, and structured to count in a reverse direction with respect to first counter;
   an adder coupled to said first and second counters, and structured to add respective current values of the first and second counters; and
   at least one comparator coupled to said adder, and structured to compare a result provided by the adder to a maximum value of the counters or to this maximum value plus one, wherein said malfunction is detected if said comparison indicates an inequality between said result and said maximum value or said maximum value plus one.

10. The electronic circuit of claim 9 wherein at least some of the first counter, second counter, adder, and at least one comparator are distributed at different locations.

11. The electronic circuit of claim 9 wherein the detection circuit is structured to detect one or several attempts of disturbance of operation of the electronic circuit.

12. The electronic circuit of claim 9 wherein the detection circuit is structured to detect a drift of an environmental parameter of the electronic circuit.

13. A method for detecting a malfunction of a first counter controlled by a first signal, the method comprising:
   setting a second counter, controlled by a second signal identical to the first signal or to its inverse, to count in a reverse direction with respect to the first counter, a maximum value of the first and second counters being identical;
   adding respective current values of the first and second counters to obtain a current sum;
   comparing said current sum to said maximum value or to said maximum value plus one; and
   determining that said malfunction exists is said comparing indicates that said current sum is unequal to said maximum value or to said maximum value plus one.

14. The method of claim 13 wherein said comparing includes:
   comparing said current sum to said maximum value using a first comparator;
   comparing said current sum to said maximum value plus one using a second comparator,
   wherein said comparators are respectively synchronized on respective edges of the first signal.

15. The method of claim 13 wherein said determining that said malfunction exists includes detecting an attempt to disturb operation of an electronic circuit having said first counter.

16. The method of claim 13 wherein said determining that said malfunction exists includes detecting a drift of an environmental parameter of an electronic circuit having said first counter.

17. The method of claim 13 wherein said first counter is initially set to count up from zero to said maximum value, and wherein said second counter is initially set to count down from said maximum value to zero.

* * * * *